US00RE43958E

(19) United States
(12) Reissued Patent
Noguchi et al.

(10) Patent Number: US RE43,958 E
(45) Date of Reissued Patent: Feb. 5, 2013

(54) SURFACE ACOUSTIC WAVE FILTER AND SAW FILTER PACKAGE

(75) Inventors: Kazushige Noguchi, Kawasaki (JP); Satoshi Terada, Yokohama (JP); Tomokazu Komazaki, Saitama (JP); Yoshikazu Kihara, Chiba (JP); Yoshiaki Fujita, Kanagawa (JP)

(73) Assignee: Intellectual Ventures Fund 77 LLC, Las Vegas, NV (US)

(21) Appl. No.: 11/328,497

(22) Filed: Jan. 10, 2006 (Under 37 CFR 1.47)

Related U.S. Patent Documents

Reissue of:
(64) Patent No.: 6,677,835
Issued: Jan. 13, 2004
Appl. No.: 09/987,988
Filed: Nov. 16, 2001

(30) Foreign Application Priority Data

Jan. 11, 2001 (JP) ..... 2001-003488

(51) Int. Cl.
*H03H 9/64* (2006.01)

(52) U.S. Cl. ..... 333/193; 333/195

(58) Field of Classification Search ..... 333/193, 333/195, 194, 196; 310/313 B, 313 D
See application file for complete search history.

(56) References Cited

U.S. PATENT DOCUMENTS 5,561,406 A * 10/1996 Ikata et al. ..... 333/126
5,905,418 A * 5/1999 Ehara et al. ..... 333/193
5,999,069 A * 12/1999 Ushiroku ..... 333/193
6,137,380 A * 10/2000 Ushiroku et al. ..... 333/193
6,150,900 A * 11/2000 Kadota et al. ..... 333/133
6,150,904 A * 11/2000 Taniguchi et al. ..... 333/193
6,369,672 B1 * 4/2002 Ikada ..... 333/193
6,489,860 B1 * 12/2002 Ohashi ..... 333/133
6,535,080 B2 * 3/2003 Taniguchi ..... 333/193

FOREIGN PATENT DOCUMENTS

| | | |
|---|---|---|
| JP | 06-164309 | 6/1994 |
| JP | 9261002 | 10/1997 |
| JP | 9-321573 | * 12/1997 |
| JP | 10-093382 | * 4/1998 |
| JP | 10163808 | * 6/1998 |
| JP | 10-242799 | 9/1998 |
| JP | 11-340779 | * 12/1999 |
| JP | 2000261344 | 9/2000 |
| JP | 3614369 | 7/2002 |
| JP | 2002208835 | 7/2002 |
| JP | 2006060871 | 3/2006 |

(Continued)

OTHER PUBLICATIONS

S. Mineyoshi et al.; "Analysis and Optimal SAW Ladder Filter Design Including Bonding Wire and Package Impedance"; IEEE 1997 Ultrasonics Symposium, vol. 1, pp. 175-178, Oct. 1997.*

(Continued)

*Primary Examiner* — Barbara Summons
(74) *Attorney, Agent, or Firm* — Turocy & Watson, LLP

(57) ABSTRACT

A polar SAW (Surface Acoustic Wave) filter includes a band-pass ladder type SAW filter having a SAW resonator. A two-terminal pair circuit is serially connected to the band-pass ladder type SAW filter and includes a plurality of inductors. The polar SAW filter has attenuation poles in each of the higher-frequency and lower-frequency attenuation ranges of a pass band.

44 Claims, 14 Drawing Sheets

FOREIGN PATENT DOCUMENTS

| | | |
|---|---|---|
| JP | 2006174515 | 6/2006 |
| JP | 2006174516 | 6/2006 |
| JP | 2006-238496 | 9/2006 |

OTHER PUBLICATIONS

Y. Satoh et al.; "A Low-Loss Band-Pass Filter Using SAW Resonators"; Institute of Electronics, Information and Communication Engineers of Japan, vol. J76-A, No. 2, pp. 245-252, Feb. 1993.*
Translation of Notice for Reason of Rejection from Japanese Patent Application No. 2001-003488; dated Oct. 10, 2003.
Translation of Notice for Reason of Rejection from Japanese Patent Application No. 2001-003488; dated Mar. 19, 2004.
Transmission Circuit; T. Sato; Japan Corono Co., Ltd.; Apr., 1964; vol. 76; Fig. 2.29 "Four Terminal Constant of Ladder Type Circuit".
Translation of Decision of Rejection from Japanese Patent Application No. 2001-003488; dated Jul. 6, 2004.
Translation of Notice for Reason of Rejection from Japanese Patent Application No. 2005-311683; dated Mar. 22, 2006.
Translation of Notice for Reason of Rejection from Japanese Patent Application No. 2006-064661; dated Apr. 25, 2006.
Translation of Notice for Reason of Rejection from Japanese Patent Application No. 2006-064662; dated Apr. 25, 2006.

* cited by examiner

*Fig. 7*

| | SERIAL ARM 1 | PARALLEL ARM 1 | PARALLEL ARM 2 |
|---|---|---|---|
| | SR1(100) | PR1(110) | PR2(111) |
| TRANSPOSITION LENGTH(μ*m) | 55 | 66 | 66 |
| PAIR NUMBER | 100 | 66 | 66 |

*Fig. 8*

| INDUCTANCE VALUE | LOWER-FREQUENCY ATTENUATION POLE (1) | LOWER-FREQUENCY ATTENUATION POLE (2) | HIGHER-FREQUENCY ATTENUATION POLE (1) | HIGHER-FREQUENCY ATTENUATION POLE (2) | LOWER-FREQUENCY 30 dB ATTENUATION WIDTH | HIGHER-FREQUENCY 30 dB ATTENUATION WIDTH |
|---|---|---|---|---|---|---|
| 0nH | 851.5 MHz | | 914.5 MHz | | 43.5 MHz | 35.0 MHz |
| 0.1nH | 851.5 MHz | 844.0 MHz | 913.0 MHz | 916.0 MHz | 47.2 MHz | 36.5 MHz |
| 0.2nH | 851.5 MHz | 840.0 MHz | 913.0 MHz | 919.0 MHz | 54.5 MHz | 36.5 MHz |
| 0.4nH | 853.0 MHz | 823.0 MHz | 913.0 MHz | 922.0 MHz | 90.8 MHz | 90.0 MHz |

*Fig. 9*

| | SERIAL ARM 1 | SERIAL ARM 2 | PARALLEL ARM 1 | PARALLEL ARM 2 | PARALLEL ARM 3 |
|---|---|---|---|---|---|
| | SR1(100) | SR2(101) | PR1(110) | PR2(111) | PR3(112) |
| TRANSPOSITION LENGTH(μ*m) | 55 | 55 | 66 | 112 | 66 |
| PAIR NUMBER | 100 | 100 | 66 | 78 | 66 |

*Fig. 10*

| INDUCTANCE VALUE | LOWER-FREQUENCY ATTENUATION POLE (1) | LOWER-FREQUENCY ATTENUATION POLE (2) | HIGHER-FREQUENCY ATTENUATION POLE (1) | HIGHER-FREQUENCY ATTENUATION POLE (2) | LOWER-FREQUENCY 30 dB ATTENUATION WIDTH | HIGHER-FREQUENCY 30 dB ATTENUATION WIDTH |
|---|---|---|---|---|---|---|
| 0nH | 851.5 MHz | | 914.5 MHz | | 13.0 MHz | 10.0 MHz |
| 0.1nH | 851.5 MHz | 848.0 MHz | 914.5 MHz | 916.0 MHz | 14.5 MHz | 11.0 MHz |
| 0.2nH | 851.5 MHz | 845.5 MHz | 914.5 MHz | 919.0 MHz | 16.0 MHz | 11.5 MHz |
| 0.5nH | 851.5 MHz | 841.0 MHz | 914.5 MHz | 916.5 MHz | 20.0 MHz | 12.0 MHz |

SURFACE ACOUSTIC WAVE FILTER AND SAW FILTER PACKAGE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a SAW (Surface Acoustic Wave) filter with an attenuation pole advantageously applicable to, e.g., a transmitter filter or a receiver filter included in a mobile communication terminal such as a cellular phone terminal.

2. Description of the Background Art

SAW filters with an attenuation pole for the above-mentioned application are disclosed in, e.g., Japanese patent laid-open publication Nos. 93382/1998 and 163808/1998, hereinafter referred to as Documents 1 and 2, respectively. Another SAW filter with an attenuation pole is proposed in Sato et al., "Small Loss, Band-Pass Filter Using SAW Resonators", Papers A, the Institute of Electronics, Information and Communication Engineers of Japan, Vol. J76-A, No. 2, pp. 245-252, 1993 (Document 3 hereinafter).

Small size, high performance parts are essential with cellular phones and other handy mobile communication terminals that are decreasing in size and weight. Specifically, there is an increasing demand for RF (Radio Frequency) parts using SAW devices.

Reference will be made to FIG. 2 for describing a ladder type SAW filter disclosed in Document 3. The ladder type SAW filter shown in FIG. 2 contributes a great deal to the miniaturization of the RF section of the terminals. SAW branching filters and other RF devices using the ladder type SAW filter have already been developed and partly put to practical use.

FIG. 3 plots an attenuation curve 201 and a return loss curve 202 particular to the SAW filter of FIG. 2, which is designed for an 800 MHz frequency band application. The horizontal and vertical axes indicate the attenuation in MHz and the frequency in dB, respectively. The curves 201 and 202 are derived from a serial arm resonator having 100 pairs with the transposition length of 100 micrometer and a parallel arm resonator having 70 pairs with the transposition length of 70 micrometer.

As shown in FIG. 4, the serial arm resonator has characteristics jx and rs in its imaginary number portion and real number portion, respectively. The parallel arm resonator has characteristics jb and rp in its imaginary number portion and real number portion, respectively.

The pass band shown in FIG. 3 ranges from around 863 MHz to around 911 MHz. As FIGS. 3 and 4 indicate, the attenuation range at the high frequency side (higher-frequency attenuation range hereinafter) of the above pass band has an attenuation pole at a point where the frequency of the serial arm resonator corresponds to infinity (about 42 dB), i.e., where the frequency is around 919 MHz. Also, the attenuation range at the low frequency side (lower-frequency attenuation range hereinafter) of the pass band has an attenuation pole at a point where the frequency of the parallel arm resonator corresponds to zero, i.e., where the frequency is around 855 MHz.

It is to be noted that FIG. 4 additionally shows the real number portions of the SAW resonators corresponding to a quality factor Q of 500.

As FIG. 3 indicates, the ladder type SAW filter shown in FIG. 2 has a single attenuation pole at each of the lower and higher frequency sides of the pass band. Therefore, the lower and higher frequency sides have substantially the same characteristic as each other, as well known in the art.

To meet the ever increasing demand for mobile communication terminals, the transmitter and receiver frequency bands are broadly allocated to both of a mobile communication system using a 800 MHz band and a mobile communication system using a 2 GHz band. The distance between the transmitter and receiver frequency bands is selected to be small in both of the above mobile communication systems.

For example, with the U.S. CDMA (Code Division Multiple Access) communication system used in the United States and allocating a frequency band of 824 MHz to 849 MHz to transmission and allocating a frequency band of 869 MHz to 894 MHz to receipt, the receiver frequency band is positioned in the higher-frequency attenuation range of the transmitter frequency band, so that the attenuation value does not have to be so great in the lower-frequency attenuation range. However, if the attenuation value in the higher-frequency attenuation range of the transmission band is small, then it is likely that a radio wave radiated from a mobile communication terminal turns round into the receiver band of the same terminal, lowering the reception quality.

To examine FIG. 3 from the above-mentioned point of view, let the attenuation curve 201 and return loss curve 202 be shifted to the left, i.e., the lower frequency side. Then, attenuation value of about −10 dB occurs in both of the higher-frequency and lower-frequency attenuation ranges. Such an attenuation value in the higher frequency range is not always enough.

By contrast, the SAW filter having the structure shown in FIG. 6, taught in, e.g., Document 1, implements a filter characteristic shown in FIG. 5. FIG. 6 shows a SAW filter with an attenuation pole LA including a ladder type SAW filter CP1, which has the configuration of a two-terminal pair circuit shown in FIG. 2, and another two-terminal pair circuit CP2 comprising a single inductor LX having inductance L. The two-terminal pair circuits CP1 and CP2 are serially connected to each other.

In FIG. 5, a downward arrow 1 indicates a point where the frequency and attenuation value are 818 MHz and −3.0609 dB, respectively. An upward arrow 2 indicates a point where the frequency and attenuation value are 843 MHz and −2.9886 dB, respectively. Further, an upward arrow 3 indicates a point where the frequency and attenuation value are 863 MHz and −43.794 dB, respectively. In addition, a further upward arrow 4 indicates a point where the frequency and attenuation values are 888 MHz and −38.099 dB, respectively.

It will be seen that a SAW filter having the characteristic shown in FIG. 5 implements a sufficient attenuation value in the higher-frequency attenuation range. Therefore, when such a SAW filter is applied to the transmitter band of the CDMA communication system used in the United States, it allows a minimum of radio wave to turn round into the receiver band and thereby enhances high quality transmission and reception.

However, even the filter characteristic shown in FIG. 5 cannot effect sufficient attenuation in the lower-frequency attenuation range. It follows that the filter characteristic available with the SAW filter taught in Document 1 is not sufficient when applied to the CDMA system in the United States as a receiver filter and is therefore likely to degrade the reception quality.

More specifically, if the SAW filter taught in Document 1 and lacking a good filter characteristic is applied to the CDMA system in the United State as a transmitter filter, then, the receiver filter fails to reduce the influence of the turn-round of a radio wave from the transmitter side of the same mobile communication terminal to a satisfactory degree. Further, the receiver filter cannot sufficiently reduce, e.g., the influence of an interference wave that may arrive at the mobile communication terminal from another radio communication apparatus.

As for systems other than the CDMA communication system in the United States, the frequency band allocated to transmission is sometimes higher than the frequency band allocated to reception. In such a case, the transmitter filter and receiver filter described above must be replaced with each other.

The SAW filters with an attenuation pole taught in Documents 1 and 2, whether they be transmitter or receiver filters, have the following problems left unsolved. In each of the SAW filters with an attenuation pole, a two-terminal pair circuit having a single inductance value L forms attenuation poles in a finite frequency range. When the attenuation poles vary, the attenuation value decreases in the lower-frequency attenuation range of the pass band and increases in the higher-frequency attenuation range of the same. It is therefore quite probable that the SAW filter will fail to satisfy a required standard in the lower-frequency attenuation range, although satisfying a required standard in the higher-frequency attenuation range.

The inductor LX, FIG. 6, may be provided with an inductance value L great enough to implement a sufficient attenuation value in the higher-frequency attenuation range. In practice, however, such a great inductance L is difficult to realize.

Moreover, if the distance between the attenuation range and the pass band, e.g., between the transmitter and receiver frequency bands of a single mobile communication terminal is as small as about 20 MHz, as stated earlier, then, the SAW filter needs a steep filter characteristic.

SUMMARY OF THE INVENTION

It is an object of the present invention to provide a polar SAW filter forming attenuation poles at each of the lower-frequency and higher-frequency attenuation ranges of a pass band to thereby solve the above-described problems, and having a steep characteristic in both of the two attenuation ranges.

In accordance with the present invention, a polar SAW filter comprises a band-pass ladder type SAW filter including a SAW resonator, and a two-terminal pair circuit serially connected to the band-pass ladder type SAW filter and including a plurality of inductors. The polar SAW filter has a plurality of attenuation poles in each of the higher-frequency and lower-frequency attenuation ranges of a pass band.

BRIEF DESCRIPTION OF THE DRAWINGS

The objects and features of the present invention will become more apparent from consideration of the following detailed description taken in conjunction with the accompanying drawings in which:

FIG. 7 shows specific transposition lengths and specific pair numbers applied to SAW resonators included in the illustrative embodiment shown in FIG. 1;

FIG. 8 shows 30 dB attenuation widths derived from attenuation poles that are available with the illustrative embodiment;

FIG. 9 shows specific transposition lengths and specific pair numbers applied to SAW resonators included in an alternative embodiment of the present invention;

FIG. 10 shows attenuation poles in a higher-frequency and a lower-frequency attenuation range and the 30 dB attenuation width that vary in accordance with an inductance value L in the alternative embodiment;

DESCRIPTION OF THE PREFERRED EMBODIMENTS

Generally, a SAW filter including an extensive number of SAW resonators achieves ideal filter characteristics, i.e., a sufficient attenuation value in both of the lower-frequency and higher-frequency attenuation ranges of a pass band with sufficient steepness established. It is however important to achieve filter characteristics close to the ideal filter characteristic with a SAW filter which includes a minimum number of SAW resonators and is as miniature as possible.

Today, a SAW filter is extensively used as an RF filter for, e.g., cellular mobile communication terminals using a 800 MHz or 2 GHz frequency band.

Figure 1:
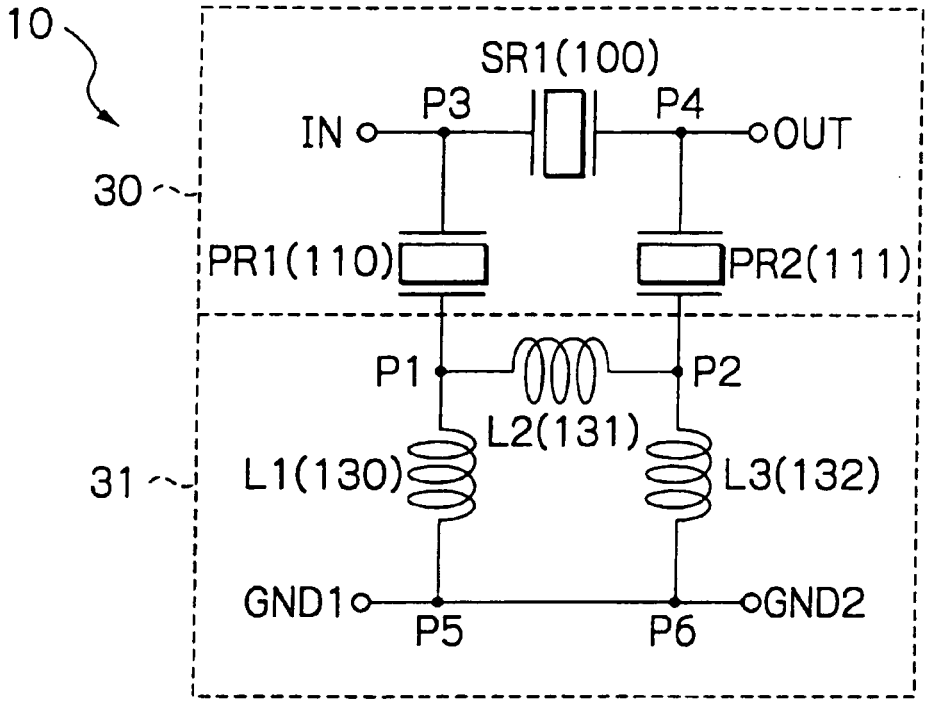
FIG. 1 is a schematic circuit diagram showing a polar SAW filter embodying the present invention.

Referring to FIG. 1, in which an embodiment of a polar SAW filter in accordance with the present invention is shown, the SAW filter, generally designated by the reference numeral 10, is applicable to, e.g., the U.S. CDMA communication system as a receiver filter included in a cellular phone. The SAW filter 10 may, of course, be implemented as a transmitter filter, as desired. As shown, the SAW filter 10 includes input terminals or ports IN and GND1, output terminals or ports OUT and GND2, three SAW resonators SR1 (100), PR1 (110) and PR2 (111), and three inductors L1 (130), L2 (131) and L3 (132), interconnected at six nodes P1, P2, P3, P4, P5 and P6 as illustrated.

Among them, the SAW resonator SR1 is interconnected between the input terminal IN and the output terminal OUT to form a serial arm SAW resonator included in the serial arm having nodes P3 and P4. The SAW resonator PR1 (110) functions as a parallel arm SAW resonator provided on parallel arms that include the nodes P3 and P1. Likewise, the SAW resonator PR2 (111) functions as a parallel arm SAW resonator provided on parallel arms that include the nodes P4 and P2. The inductor L2 (131) is connected between the nodes P1 and P2. The nodes P5 and P6 are positioned between the input terminal GND1 and the output terminal GND2. The inductor L1 (130) is connected between the nodes P1 and P5. Further, the inductor L3 (132) is connected between the nodes P2 and P6.

The input terminal IN, nodes P3 and P4 and SAW resonators SR1 (100), PR1 (110) and PR2 (111) constitute a two-terminal pair circuit 30. Likewise, the nodes P1, P2, P5 and P6, inductors L1 (130) through L3 (132) and terminals GND1 and GND2 constitute another two-terminal pair circuit 31. The two-terminal pair circuits 30 and 31 are serially connected to each other. It is to be noted that labels L1, L2 and L3 will sometimes represent the inductance values of the inductors also.

Figure 11:
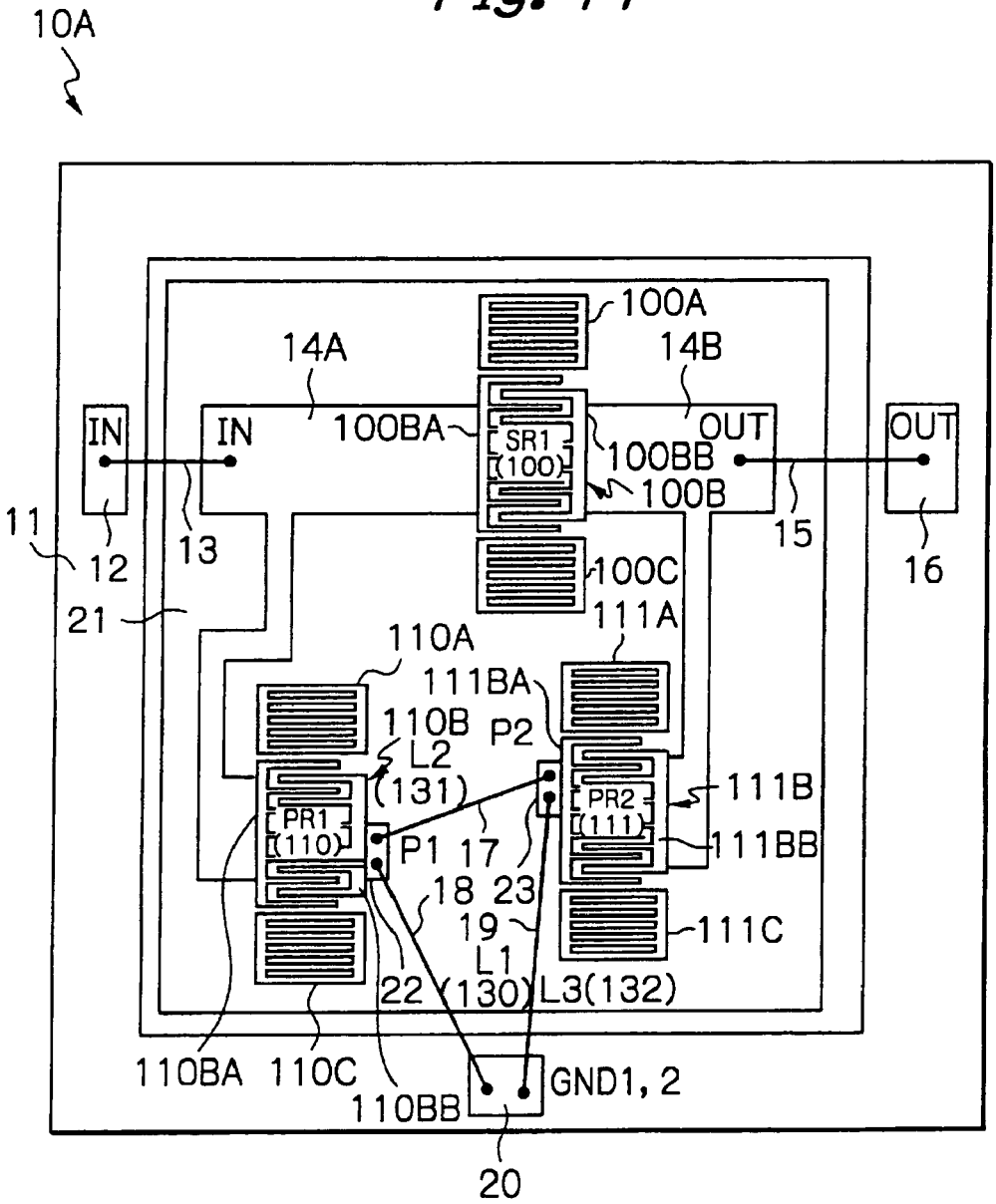
FIG. 11 is a plan view conceptually showing a specific SAW filter package having the configuration shown in FIG. 1 with its cover removed.

FIG. 11 shows in a plan view a specific SAW filter package 10A constructed in accordance with the circuitry of FIG. 1 by fine processing, which is customary with the IC (Integrated Circuit) fabrication. As shown, the SAW filter package 10A includes contact pads 12 and 16, and a piezoelectric substrate 21 formed on a package 11.

Electrode strips 14A and 14B are arranged on the piezoelectric substrate 21 in the form of a letter π and made of, e.g., tungsten. A SAW resonator SR1 (100) is connected to the electrode strips 14A and 14B. Saw resonators PR1 (110) and PR2 (111) are connected to the electrode strips 14A and 14B, respectively. The SAW resonator 100 includes two grating reflectors 100A and 100C and an interdigital transducer (IDT) 100B intervening between the reflectors 100A and 100B.

A comb line electrode 100BA, which constitutes the interdigital transducer 100B, is electrically connected to the electrode strip 14A. Another comb line electrode 100BB that constitutes the interdigital transducer 100B is electrically connected to the electrode strip 14B.

The other SAW resonators 110 and 111 are identical in configuration with the SAW resonator 100. Specifically, the SAW resonator 110 has two grating reflectors 110A and 110C and an interdigital transducer 110B intervening between the reflectors 110A and 110C. The SAW generator 111 includes two grating reflectors 111A and 111C and an interdigital transducer 111B intervening between the reflectors 111A and 111C.

A comb line electrode 110BA, which constitutes the interdigital transducer 110B, is electrically connected to the electrode strip 14A. Another comb line electrode 110BB that constitutes the interdigital transducer 110B is electrically connected to a contact pad 22, which corresponds to the junction P1, FIG. 1. Likewise, a comb line electrode 111BA, which constitutes the interdigital transducer 111B, is electrically connected to another contact pad 23 corresponding to the node P2, FIG. 1. Another comb line electrode 111BB constituting the interdigital transducer 111B is electrically connected to the electrode strip 14B.

In the illustrative embodiment, the SAW resonators SR1, PR1 and PR2 each have a particular transposition length and a particular pair number, as shown in FIG. 7. As shown, the serial arm resonator SR1 has a transposition length of 55 micrometers and includes 100 pairs. The parallel arm resonator PR1 has a transposition length of 66 micrometers and includes 66 pairs. The parallel arm resonator PR2 has a transposition length of 66 micrometers and 66 pairs.

Referring again to FIG. 11, the contact pad 12 and electrode strip 14A are interconnected by a bonding wire 13 having a sufficiently small inductance component. Also, the contact pad 16 and electrode strip 114B are interconnected by a bonding wire 15 also having a sufficiently small inductance component. On the other hand, bonding wires 17, 18 and 19 are used as inductors, and each has a desired inductance value L. The bonding wires 17, 18 and 19 correspond to the inductors L1, L2 and L3, respectively. In the illustrative embodiment, the bonding wires 17, 18 and 19 have the same inductance value L, e.g., 0.1 nH.

Figure 6:
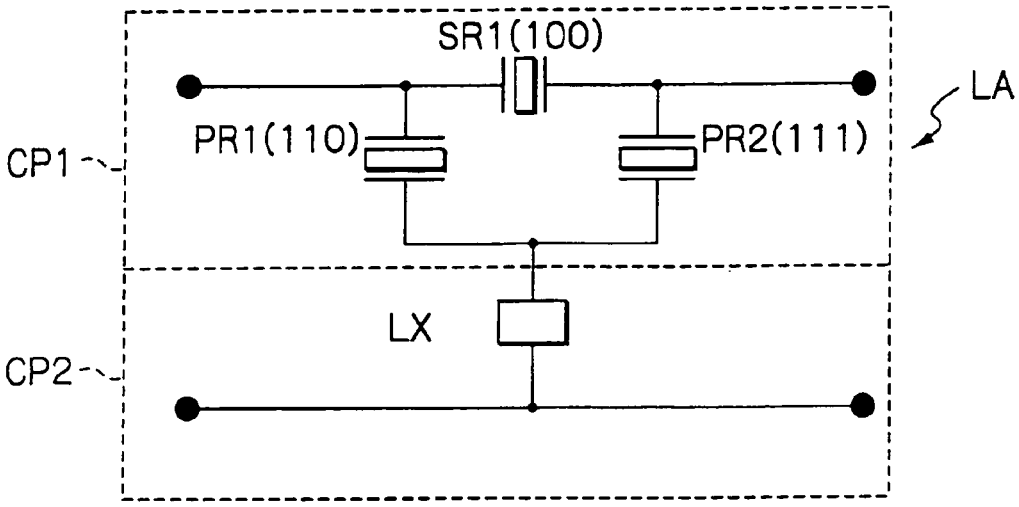
Fig. 6 PRIOR ART
FIG. 6 is a schematic circuit diagram showing the conventional SAW filter having the characteristic of FIG. 5.

The SAW filter 10 shown in FIG. 1 differs from the conventional SAW filter shown in FIG. 6 as to, among others, the configuration of the two-terminal pair circuit 31.

Figure 12:
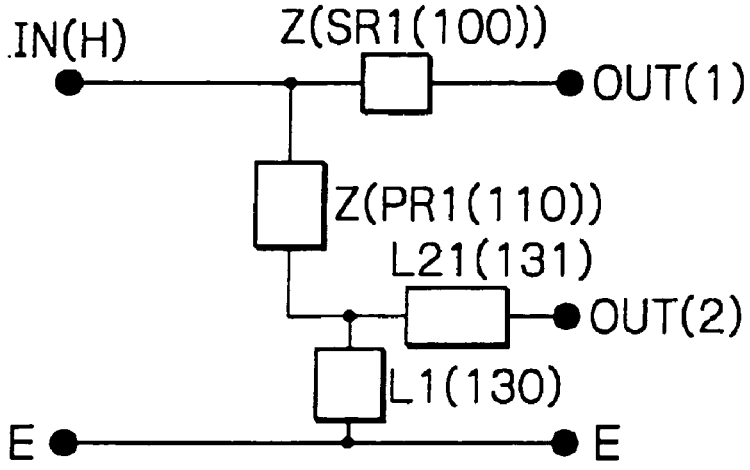
FIG. 12 is a bisected circuit diagram useful for understanding the operation of the embodiment shown in FIG. 1.
Figure 13:
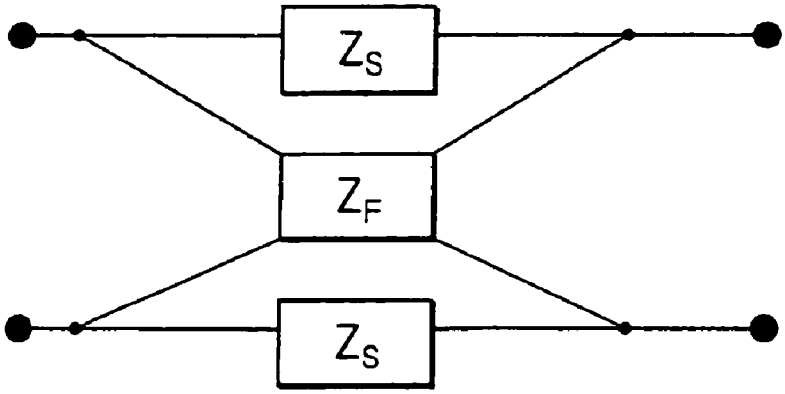
FIG. 13 is a circuit diagram showing a ladder type equivalent circuit useful for understanding the characteristics of the circuit shown in FIG. 12.

The operation of the illustrative embodiment will be described with reference to FIGS. 12 and 13. FIG. 12 shows the bisected circuit of the polar SAW filter 10. FIG. 13 shows a lattice type equivalent circuit useful for understanding the operation of the SAW filter 10.

As shown in FIG. 1, the ladder type SAW filter 10 has three SAW resonators SR1 (100), PR1 (110) and PR2 (111) arranged in a two stage, π configuration. The two-terminal pair circuit 31, including three inductors L1 (130), L2 (131) and L3 (132), is serially connected to the two-terminal pair circuit 30, as stated previously. The bisected circuit of FIG. 12 will be used to estimate the operation of the SAW filter 10 and to determine a relation between the attenuation pole frequency of the SAW filter 10 and the inductance value L.

Assume that the circuit of FIG. 12 has an input impedance ZF when terminals OUT(1), OUT(2) and E are disconnected, and that it has an input impedance ZS when the terminals OUT(1), OUT(2) and E are connected, i.e., under a short-circuited condition. Then, the input impedance ZF is expressed as:

$$ZF=Z(PR1\ (110))+j\omega L1\ (130), \tag{1}$$

where Z(PR1 (110)) denotes the impedance of the parallel arm resonator 110, FIG. 12, and ω is equal to 2.0*π*f where f denotes frequency, where * denotes multiplication.

Likewise, the input impedance ZS is expressed as:

$$ZS=1/((1/Z(SR1\ (100))+1/(1/Z(PR1\ (110))+ j\omega(1/(1/L1\ (130)+1/L21\ (131)), \tag{2}$$

where Z(PR1 (110) denotes the impedance of the parallel arm resonator 110, FIG. 12, L21 (131) has an inductance value L equal to one-half of the inductance value of L2 (131), i.e., L21 (131)=L2 (131)/2, and Z(SR1 (100)) denotes an impedance equal to one-half of the impedance of the serial arm resonator 100, FIG. 12."

Usually, the characteristics of the circuit shown in FIG. 12 is estimated in terms of the characteristics of the lattice type circuit shown in FIG. 13. More specifically, the circuit of FIG. 13 has an operation transfer coefficient corresponding to the characteristic SF of the circuit shown in FIG. 12. The operation transfer coefficient is produced by substituting the impedances ZF and ZS of expressions (1) and (2) for a following expression:

$$SF=(1+ZF)(1+ZS)/(ZF-ZS). \quad (3)$$

Therefore, an attenuation characteristic á(ω) is expressed as:

$$á(\omega)=20*LOG\ (ABS(SF)), \quad (4)$$

where ABS ( ) denotes an absolute value inside the parentheses.

More specifically, the inductance value L forms an attenuation pole frequency in the attenuation band or increases attenuation only if either one of the following conditions is satisfied:

$$ZF=ZS \quad (5A)$$

$$ZS=\infty \quad (5B)$$

The illustrative embodiment is characterized in that ZF and ZS represented by expressions (1) and (2) include inductance values L1 and L21, respectively. The inductance values L included in both of ZF and ZS allow an attenuation pole frequency to be formed in the attenuation band by satisfying expression (5A) or allows the attenuation value to be increased by satisfying expression (5B). This will be described more specifically with reference to FIG. 14.

Figure 14:
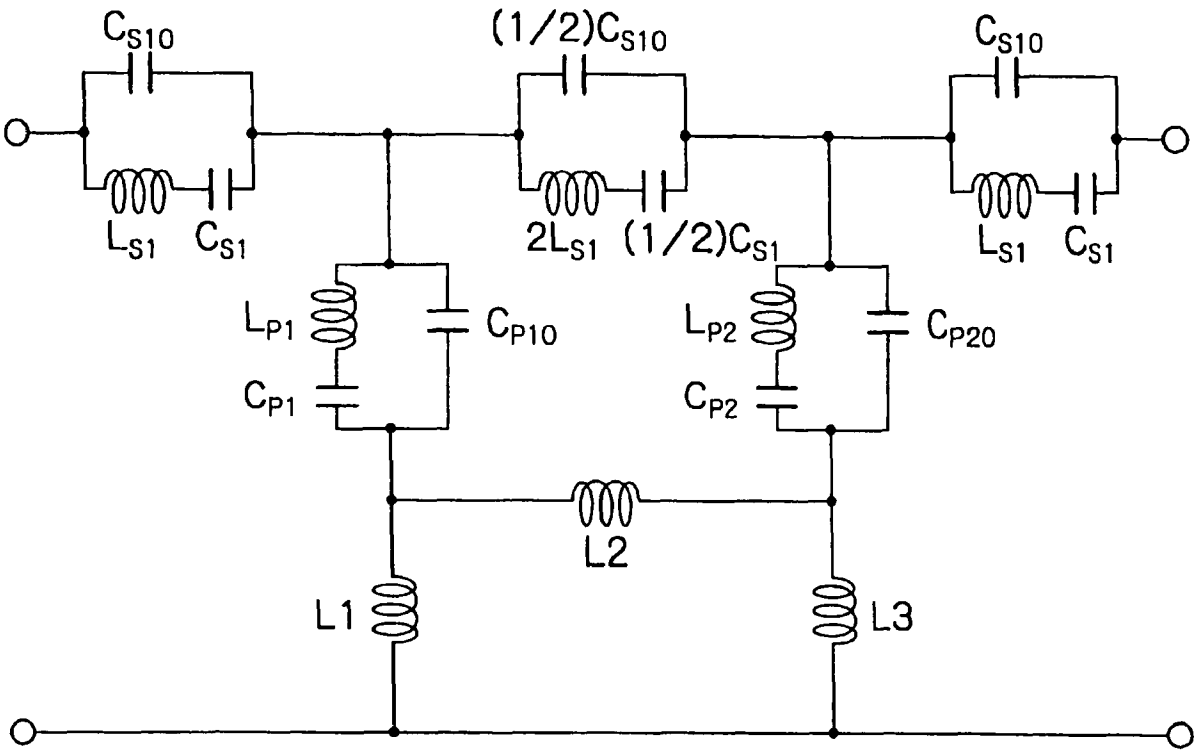
FIG. 14 is an LC equivalent circuit useful for understanding the operation of the embodiment shown in FIG. 1.

FIG. 14 shows the LC equivalent circuit of the SAW resonator. When the LC equivalent circuit is used, expression (1) is rewritten into:

$$ZF=(S^2+\omega1^2+S^2*L11*Cf*(S^2+\omega2^2))/(S*Cf*(S^2+\omega2^2)), \quad (6)$$

where L11 is equal to L1 (130), Cf denotes the capacitance of parallel arms, ω1 denotes zero of the parallel arms, i.e., a point where impedance is zero, and ω2 denotes the pole of the parallel arms, i.e., a point where impedance is the maximum or the minimum.

Also, expression (2) is written into:

$$ZS=(S^2+3^2+S^2*L22*Cs*(S^2+\omega4^2))/(S*Cs*(S^2+\omega4^2)), \quad (7)$$

where 1/L22=1/L1 (130)+1/L21 (131) hold, Cs denotes the capacitance of serial arms, ω3 denotes zero of the serial arms, and ω4 denotes the pole of the serial arms, i.e. a point where impedance is the maximum or the minimum.

Therefore, by using expressions (6) and (7) and expression (5A), which defines a condition for forming an attenuation pole, a frequency that implements an attenuation pole is produced by:

$$Cf*(S^2+\omega2^2)*(S^2+\omega1^2+S^2*L11*Cf*(S^2+\omega2^2))=(S^2+\omega3^2+S^2*L22*Cs*(S^2+\omega4^2))*Cs*(S^2+\omega4^2)) \quad (8)$$

The illustrative embodiment is characterized in that the above expression (8) contains L11 and L22. L22, in particular, allows an attenuation pole frequency derived from expression (8) to constitute the lower-frequency attenuation range of the pass band.

Next, the illustrative embodiment will be compared with the conventional SAW filter LA shown in FIG. 6. The impedance ZF of the SAW filter LA is produced by:

$$ZF=Z(PR1(110))+j\omega L11(130), \quad (9)$$

where Z(PR1 (110) denotes the impedance of the parallel arm resonator 110, FIG. 6, L11 (130) is equal to 2.0*L1 (130), and ω is produced by ω=2.0*π*f where f is a frequency.

Likewise, the impedance ZS of the SAW filter LA is produced by:

$$ZS=1/((1/Z(SR1(100))+1/(1/Z(PR1(110)), \quad (10)$$

where Z(SR1 (100)) denotes an impedance equal to one-half of the impedance of the serial arm resonator 100, FIG. 6.

By comparing the corresponding expressions with each other, it will be seen that the illustrative embodiment is far different from the SAW filter LA of FIG. 6 in that the impedance ZS includes L. In this case, a pole frequency corresponding to expression (8) is expressed as:

$$Cf*(S^2+\omega2^2)*(S^2+\omega1^2+S^2*L11*Cf*(S^2+\omega2^2))=Cs*(S^2+\omega3^2)*(S^2+\omega4^2)) \quad (11)$$

As for the SAW filter LA, a frequency that forms an attenuation pole by using the condition of expression (5A), i.e., ZF=ZS is produced by the above-indicated expression (11). By contrast, the above-mentioned frequency is produced by expression (8). While expression (8) contains both of L11 and L22, expression (11) contains only L11. Therefore, in the conventional SAW filter LA, an attenuation pole is formed in the higher-frequency attenuation range of the pass band.

Figure 15:
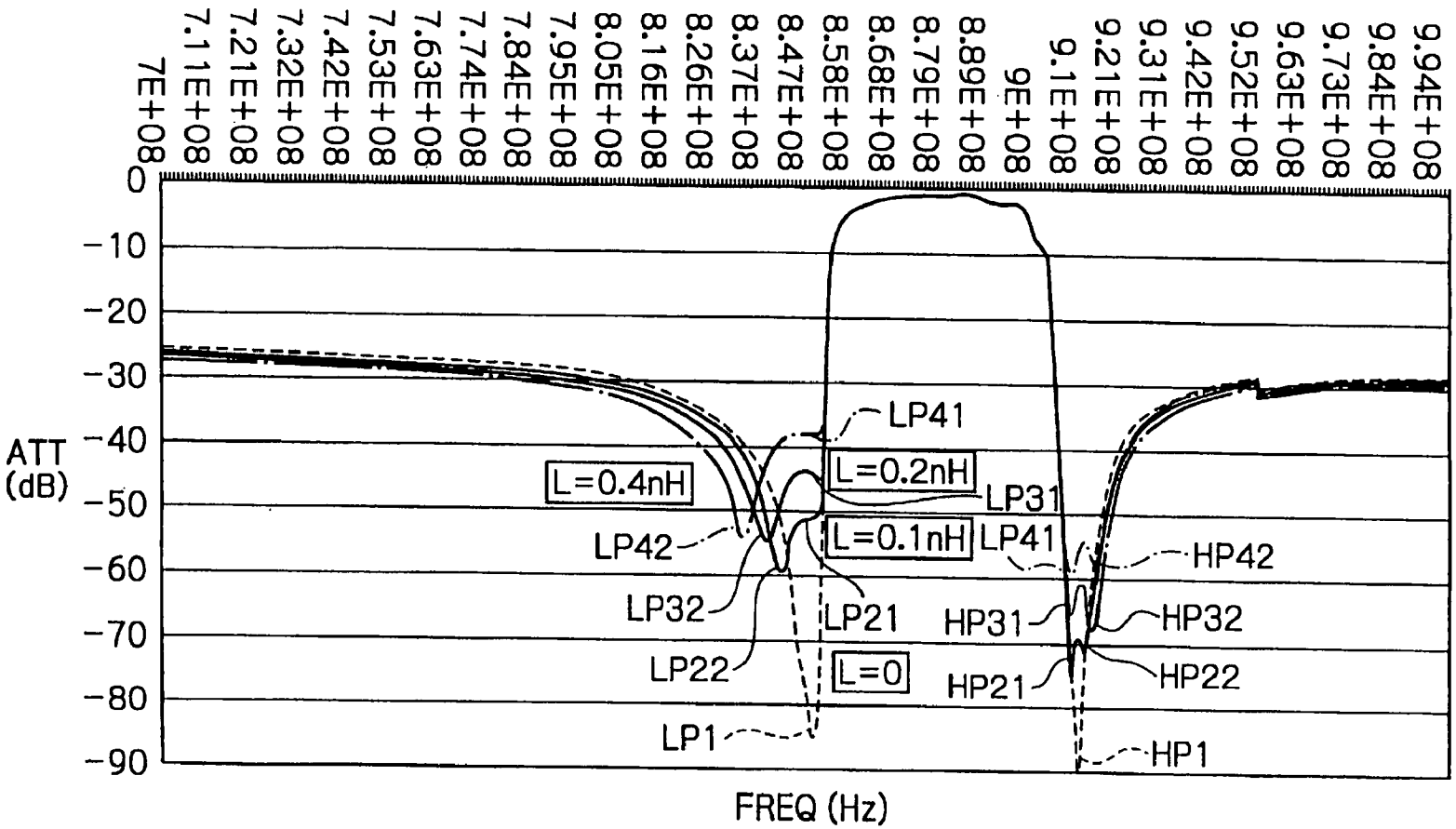
FIG. 15 is a graph plotting the results of simulation conducted to determine the characteristics of the embodiment shown in FIG. 1.

FIG. 15 shows characteristic curves representative of the results of simulation conducted with the illustrative embodiment. For the simulation, the inductance values of the three inductors L1 (130), L2 (131) and L3 (132) included in the two-terminal pair circuit 31 were used as a parameter. In FIG. 15, a characteristic curve L=0 corresponds to the filter characteristic of the conventional two stage, ladder type SAW filter shown in FIG. 2. As FIG. 15 indicates, the illustrative embodiment is advantageous over the conventional SAW filter shown in FIG. 2 in the following three respects.

First, the inductance values L1 (130), L2 (131) and L3 (132) form attenuation poles LP21, LP31, LP41 and LP22, LP32, LP42 in the lower-frequency attenuation range of the pass band, which ranges from about 860 MHz to about 900 MHz. In addition, the inductance values L1, L2 and L3 form attenuation poles HP21, H31, HP41 and HP22, HP32, HP42 in the higher-frequency attenuation range of the above pass band. The attenuation poles LP21 and LP22 correspond to L=0.1 nH while the attenuation poles LP31 and LP32 correspond to L=0.2 nH. The attenuation poles LP41 and LP42 correspond to L=0.4 nH. Likewise, the attenuation poles HP21 and HP 22 correspond to L=0.1 nH while the attenuation poles HP31 and HP32 correspond to L=0.2 nH. Further, the attenuation poles HP41 and HP42 correspond to L=0.4 nH.

Figure 2:
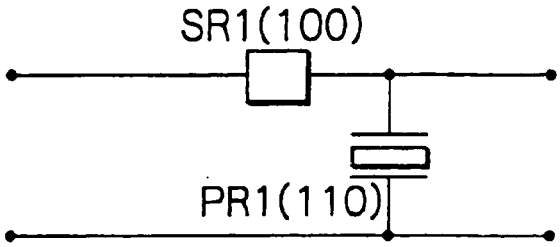
Fig. 2 PRIOR ART
FIG. 2 is a schematic circuit diagram showing a conventional, ladder type SAW filter.
Figure 3:
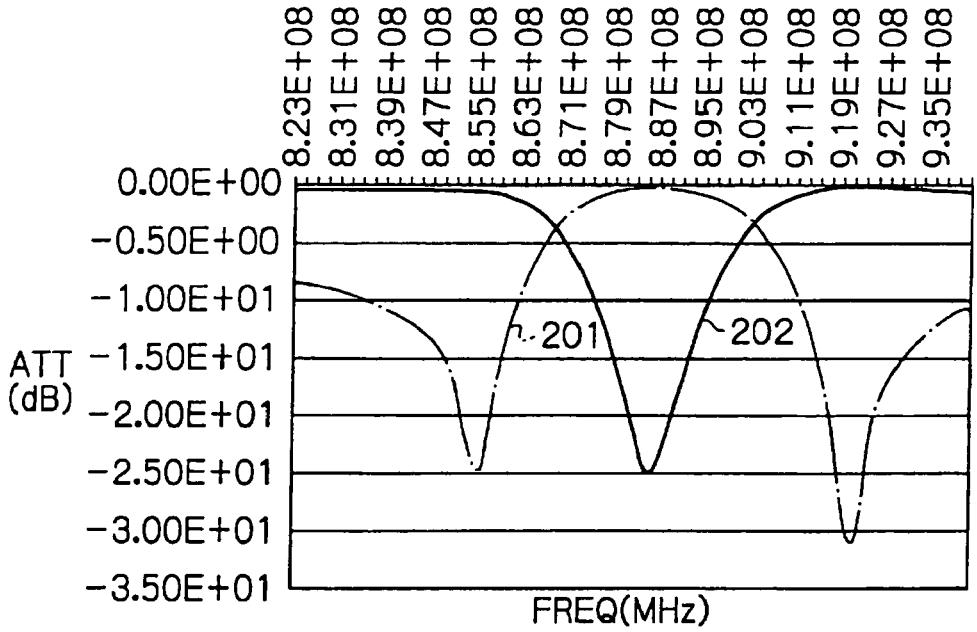
Fig. 3 PRIOR ART
FIG. 3 is a graph plotting the characteristics particular to the conventional SAW filter of FIG. 2.
Figure 4:
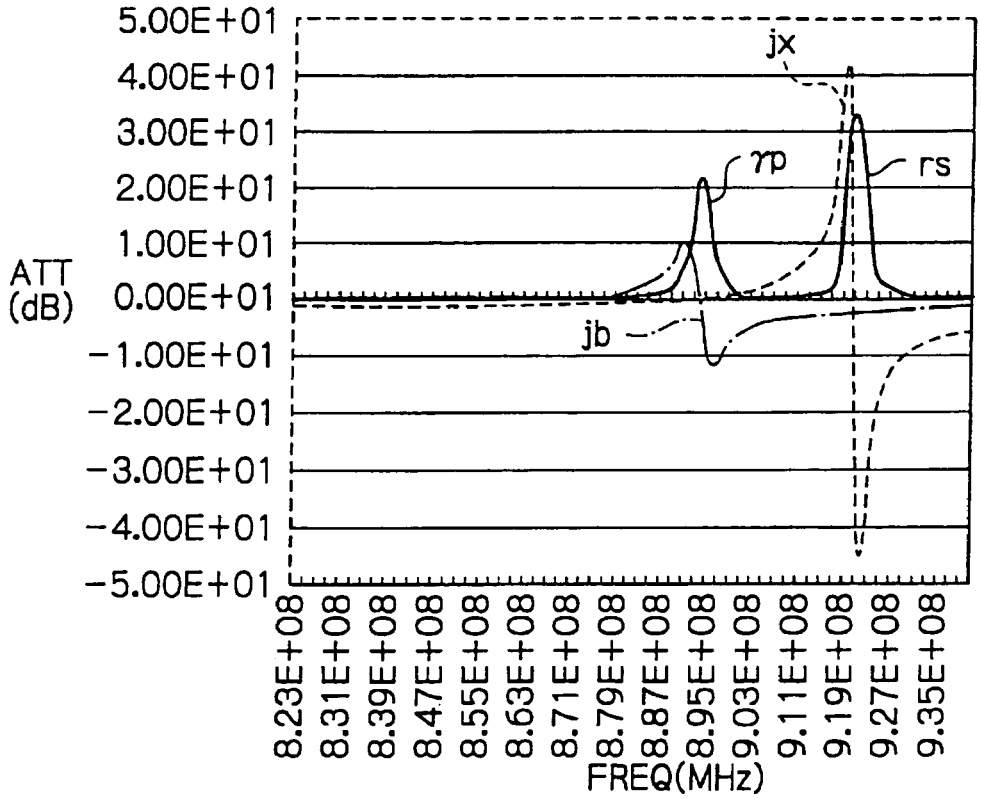
Fig. 4 PRIOR ART
FIG. 4 plots the characteristics particular to the serial and parallel arm resonators included in the conventional SAW filter of FIG. 2.
Figure 5:
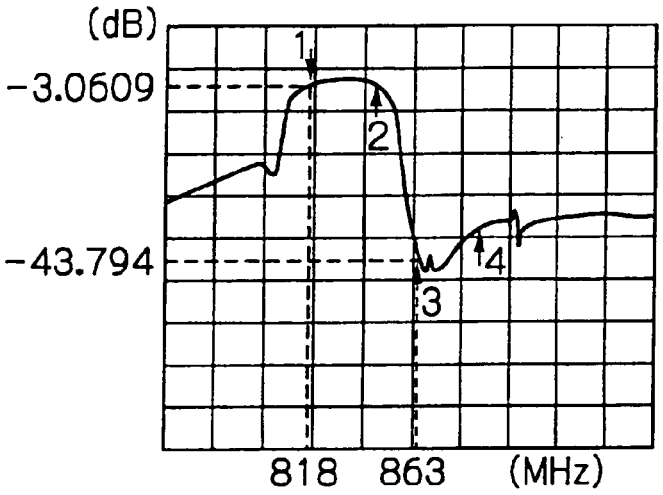
Fig. 5 PRIOR ART
FIG. 5 is a graph plotting the filter characteristic particular to another conventional SAW filter.

Second, as shown in FIG. 8, the attenuation poles particular to the illustrative embodiment broaden a 30 dB attenuation width, i.e., the width of a frequency band in which the attenuation value is as great as 30 dB or above. For example, as for L=0.2 nH, the 30 dB attenuation width achievable with the illustrative embodiment is 54.5 MHz in the lower-frequency attenuation range or 36.5 MHz in the higher-frequency attenuation range. By contrast, the 30 dB attenuation width available with the SAW filter of FIG. 2 is only 43.5 MHz in the lower-frequency attenuation range or only 35.0 MHz in the higher-frequency attenuation range. The 30 dB attenuation width of the illustrative embodiment is broader than the conventional width by 11.5 MHz in the lower-frequency attenuation range or by 1.5 MHz in the higher-frequency attenuation range. The illustrative embodiment therefore successfully improves the attenuation characteristic of a polar SAW filter.

Third, as shown in FIG. 15, the illustrative embodiment maintains the slope between the pass band and the attenuation band constant and sufficiently steep without regard to the inductance values L1, L2 and L3.

As for actual products, filter characteristics required of a SAW filter are determined in consideration of an amplifier, a modulator and so forth to be built in, e.g., a mobile communication terminal together with the SAW filter. The illustrative embodiment can deal with this kind of considerations as well.

As stated above, the two-terminal pair circuit 31 included in the illustrative embodiment forms two attenuation poles in each of the higher-frequency and lower-frequency attenuation ranges of the pass band. The attenuation value based on the variation of the attenuation poles is sufficiently great not only in the higher-frequency attenuation range, but also in the lower-frequency attenuation range. This satisfies a required attenuation standard in both of the higher-frequency and lower-frequency attenuation ranges.

Further, the illustrative embodiment realizes the above filter characteristics by use of a miniature SAW filter having sufficiently small inductance values and is therefore highly practical. In addition, the filter characteristics of the illustrative embodiment are sufficiently steep, as stated earlier.

The illustrative embodiment with the above advantages enhances signal reception quality when applied to, e.g., the U.S. CDMA system as a receiver filter. The illustrative embodiment can, of course, be implemented as a transmission filter, as desired.

An alternative embodiment of the present invention will be described with reference to FIG. 16. As shown, a polar SAW filter, generally denoted with a reference numeral 40, is similar to the polar SAW filter 10 shown in FIG. 1. In the figures, identical reference numerals designate like structural elements. The following description will concentrate on differences between the SAW filters 10 and 40.

The SAW filter 40 additionally includes a serial arm resonator SR2 (101), a parallel arm resonator PR3 (112) and an inductor L4, interconnected as shown at junctions P7 and P8.

The serial arm resonator SR2 serves as a SAW resonator identical with the serial arm resonator SR1, FIG. 1. The parallel arm resonator PR3 serves as a SAW filter identical with the parallel arm resonator PR1 or PR2, FIG. 1. The inductor L4 may be identical with any one of the inductors L1, L2 and L3, FIG. 1. Stated another way, the SAW filter 40 has a two-terminal pair circuit constituting a four stage, ladder type SAW filter arranged in a $\pi$ configuration and a two-terminal pair circuit having three inductance values L, i.e., the inductors L1 (130), L2 (131) and L3 (132). The two-terminal pair circuits are serially connected to each other.

Figure 16:
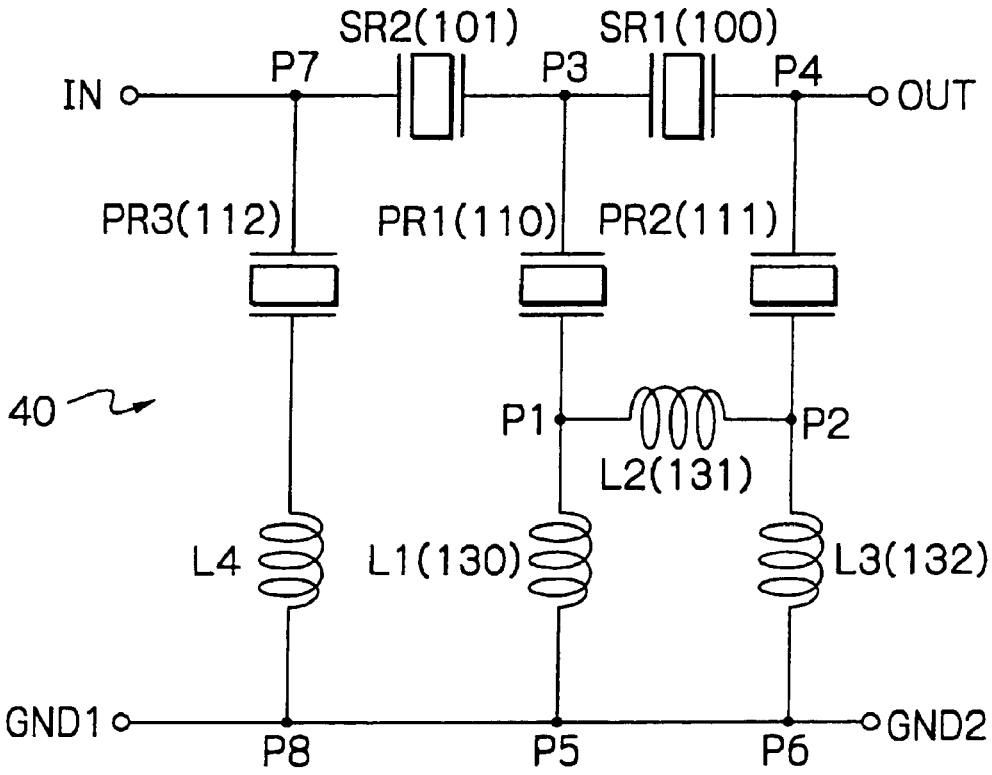
FIG. 16 is a schematic circuit diagram showing the alternative embodiment.
Figure 17:
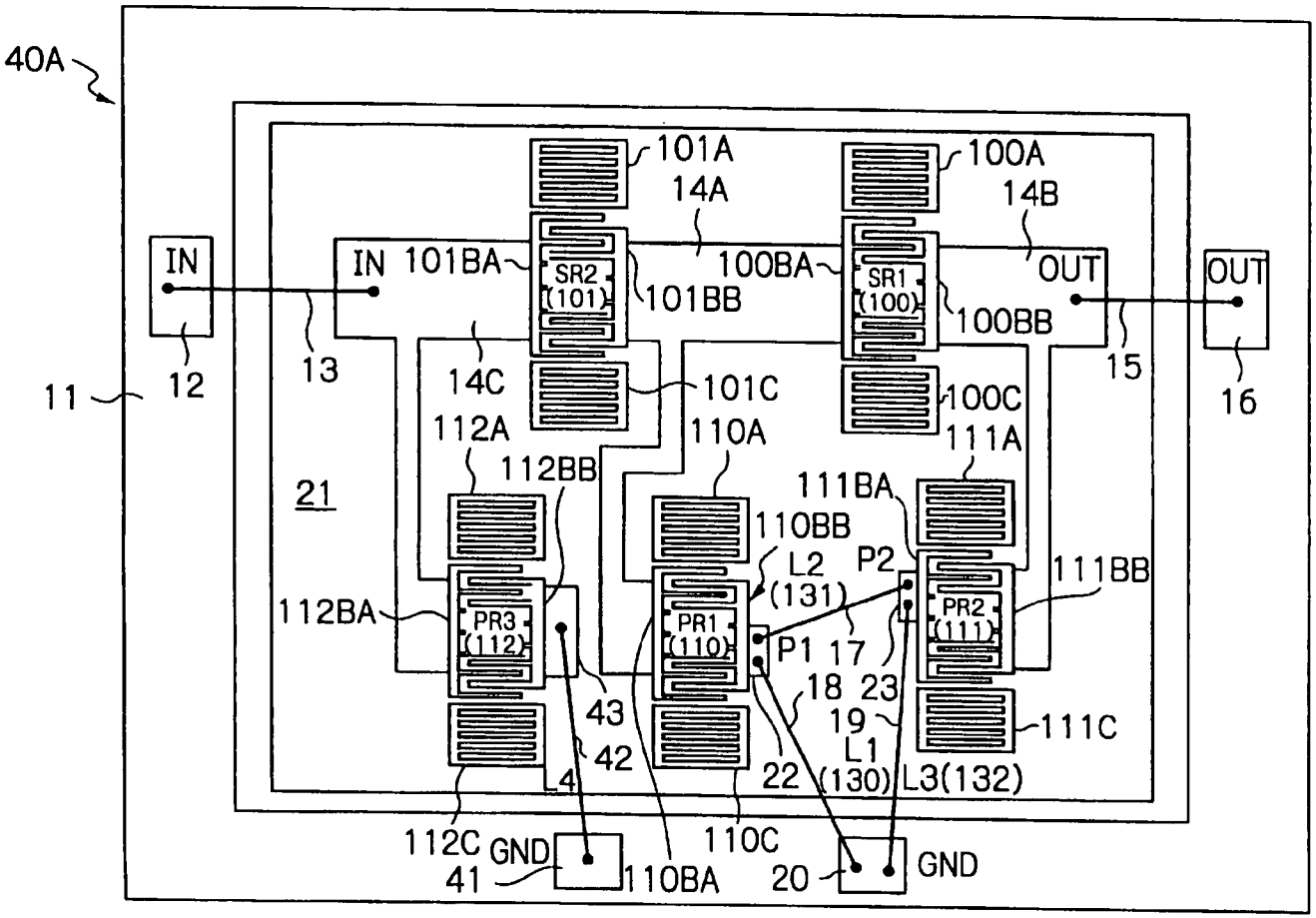
FIG. 17 shows a plan view, similar to FIG. 11, of a specific SAW filter package having the configuration shown in FIG. 16 with its cover removed.

"FIG. 17 shows in a plan view a specific SAW filter package 40A constructed in accordance with the circuitry of FIG. 16. In FIGS. 11 and 17, identical reference numerals designate like structural elements. As shown, the package 40A additionally includes the serial arm resonator SR2 (101), parallel arm resonator PR3 (112) and inductor L4 as well as contact pads 41 and 43. A bonding wire 42 connects the contact pads 41 and 43 and plays the role of the inductor L4. In the package 40A, not the electrode strip 14A but the electrode strip 140 is connected to the contact pad 12 by the bonding wire 13 for layout reasons."

Figure 18:
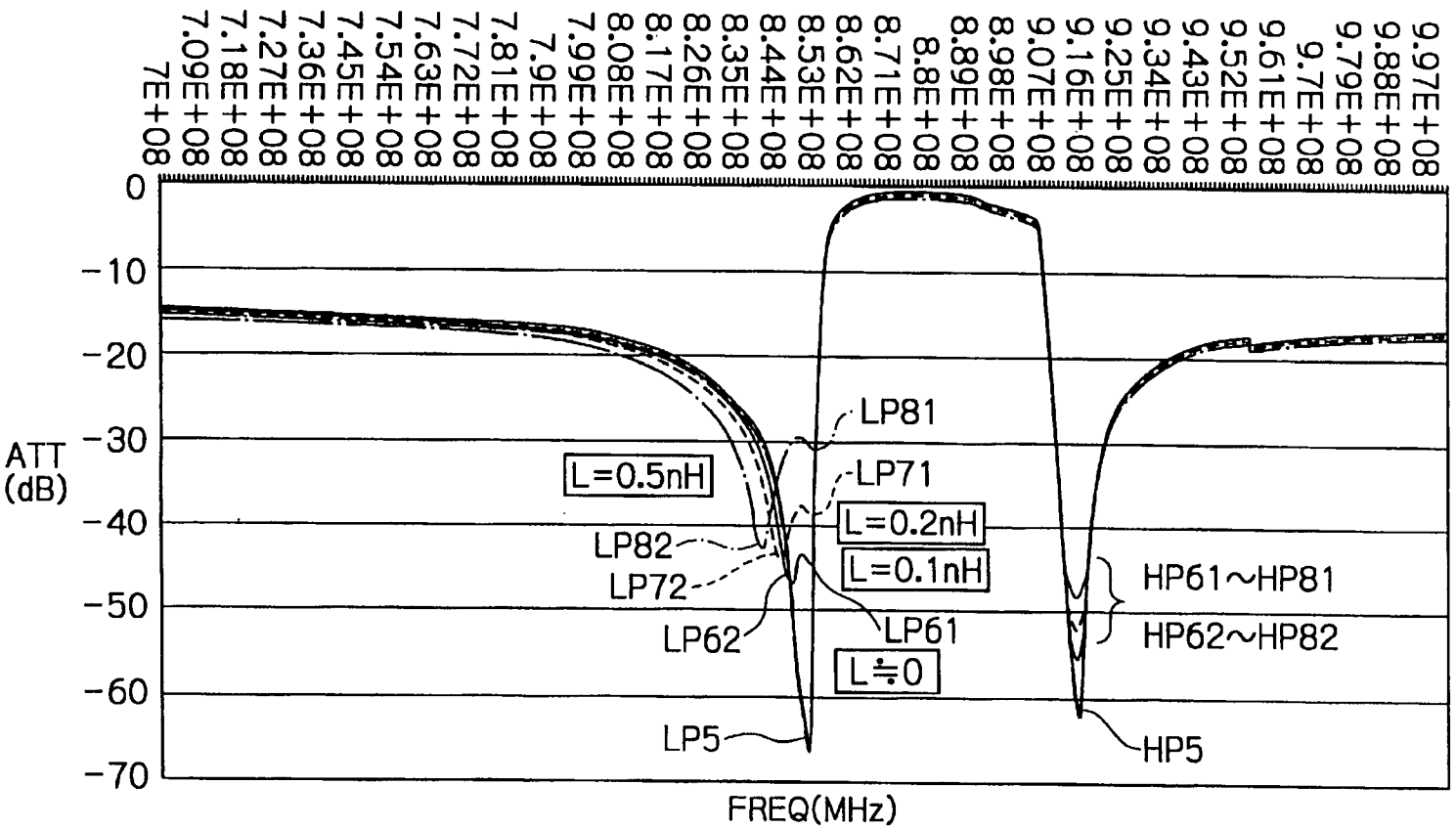
FIG. 18 is a graph, similar to FIG. 15, plotting the results of simulation conducted with the alternative embodiment.

FIG. 18 shows the results of simulation conducted with the transposition lengths and pair numbers shown in FIG. 9 by using the inductance value L as a parameter. FIG. 10 shows how the attenuation poles in the lower-frequency and higher-frequency attenuation ranges and the 30 dB attenuation width vary in dependent upon the inductance value L.

As FIGS. 10 and 18 indicate, attenuation poles are formed in the lower-frequency and higher-frequency attenuation ranges of the pass band in accordance with the inductance value L of the inductors L1 through L4. For example, when the inductance value L is 0.5 nH, two attenuation poles are formed at the frequencies of 851.5 MHz and 841.0 MHz in the lower-frequency attenuation range. The frequencies of 851.5 MHz and 841.0 MHz respectively correspond to points LP81 and LP82 shown in FIG. 18.

It follows from the two attenuation appearing poles that for the inductance value L of 0.5 nH, the 30 dB attenuation width is 20.0 MHz in the lower-frequency attenuation range or 12.0 MHz in the higher-frequency attenuation range. The illustrative embodiment therefore broadens the 30 dB attenuation width by 7 MHz in the lower-frequency attenuation range and broadens it by 2 MHz in the higher-frequency attenuation range, compared to the conventional, ladder type SAW filter. In this manner, the illustrative embodiment remarkably improves the attenuation characteristics in the lower-frequency and higher-frequency attenuation ranges and satisfies required standards. Moreover, as shown in FIG. 18, the slope between the pass band and the attenuation band is sufficiently steep without regard to the inductance value L of the inductors L1 through L4.

As stated above, the illustrative embodiment allows the attenuation characteristics to be relatively freely controlled in both of the lower-frequency and higher-frequency attenuation ranges. The illustrative embodiment, of course, achieves the advantages described in relation to the previous embodiment as well.

While many specific numerical values have been used to simplify the description of the previous embodiments, they are, of course, only illustrative and do not limit the scope of the present invention. While the inductance value L can therefore be replaced with any other suitable value, the present invention is practicable with small inductance values L.

Figure 19:
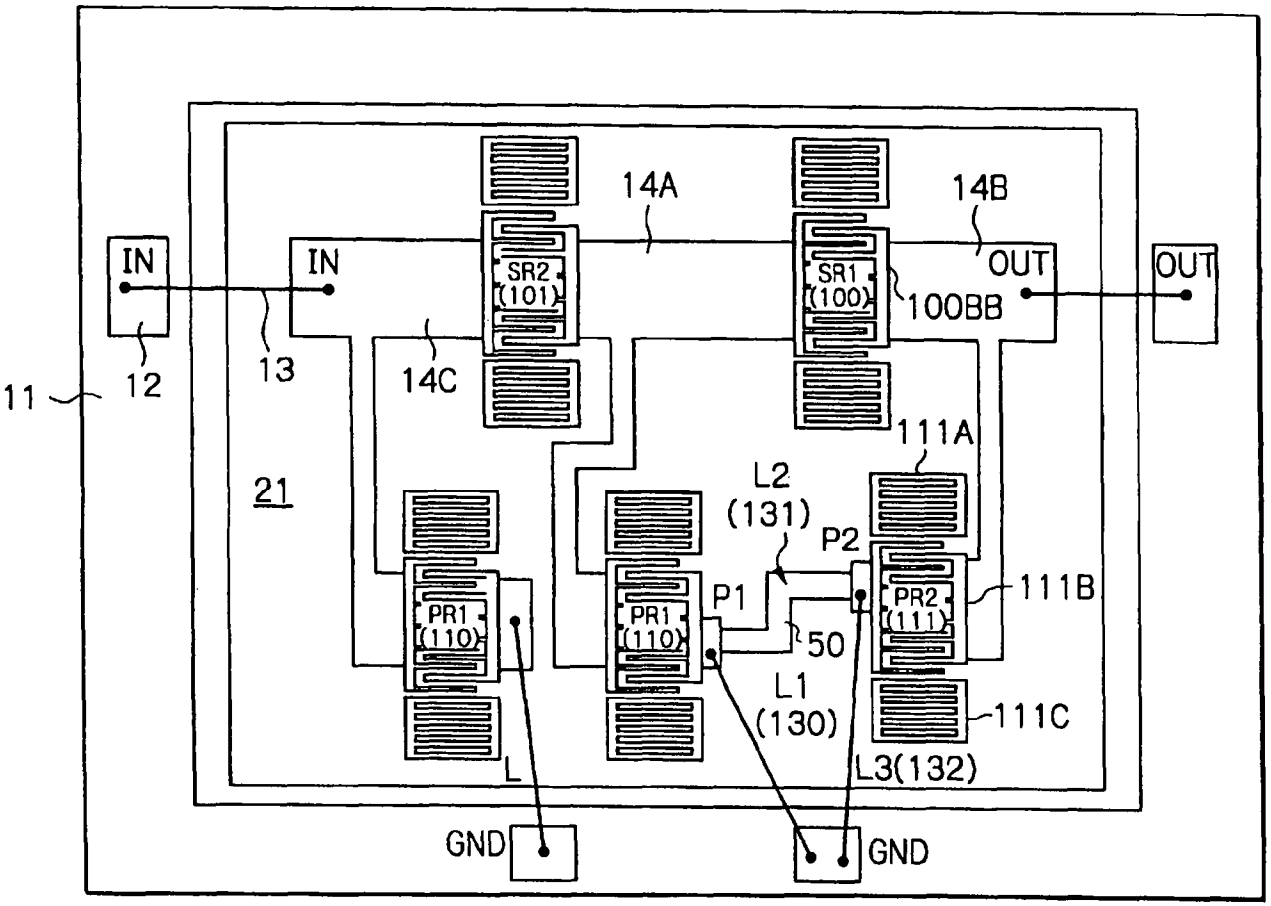
FIG. 19 shows in a plan view, similar to FIG. 17, a specific SAW filter package that may be substituted for the package shown in FIG. 17 with its cover removed.

FIG. 19 shows a specific SAW filter package that may be substituted for the package 40A of FIG. 17. As shown, the package of FIG. 19 includes an electrode pattern 50 that serves as an inductance in place of the bonding wire 17 (L2). In this manner, the inductor included in the two-terminal pair circuit of the present invention can advantageously be implemented by a laminate substrate package.

Figure 20:
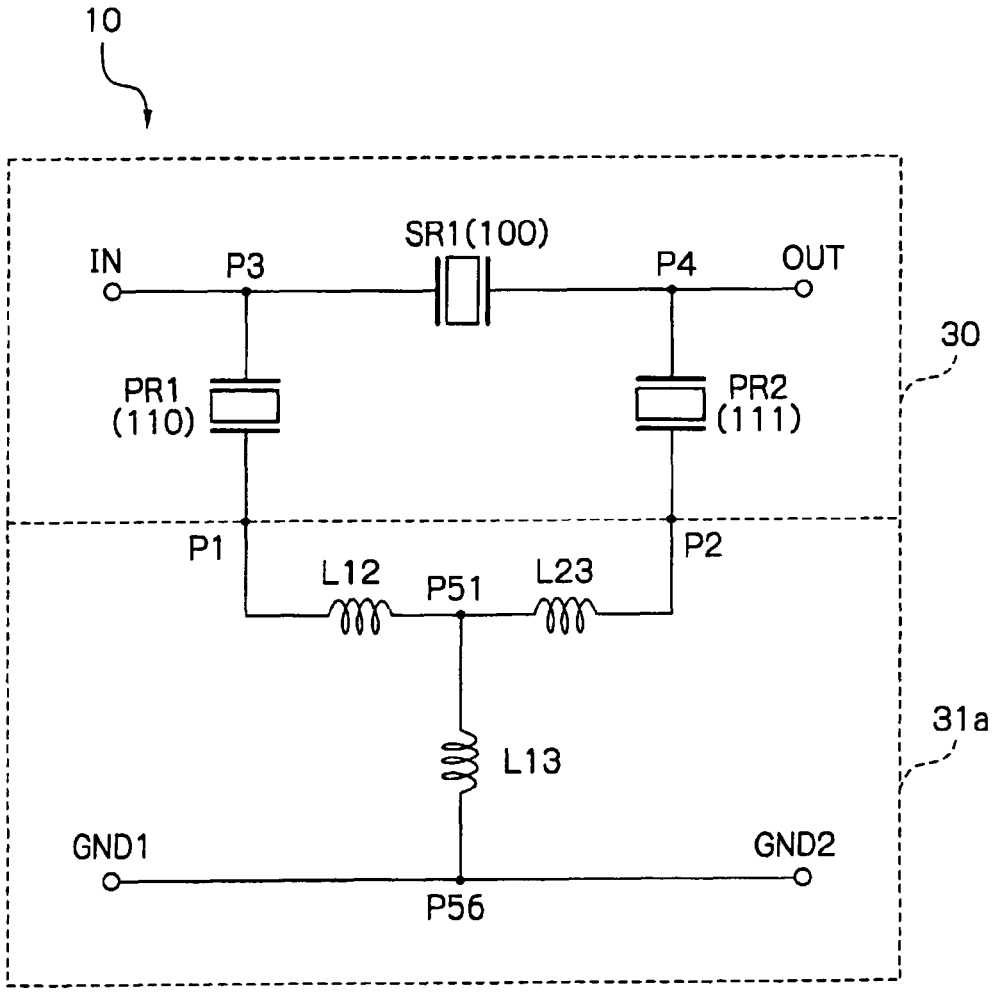
FIG. 20 is a schematic circuit diagram, similar to FIG. 1, showing an alternative embodiment of the polar SAW filter in accordance with the present invention.

With reference to FIG. 20, an alternative embodiment of the invention includes a two-terminal circuit 31a replaced for the two-terminal circuit 31 included in the embodiment shown in and described with reference to FIG. 1. In the figure, like elements are denoted with the same reference numerals or letters as in FIG. 1. With the alternative embodiment, the two-terminal circuit 31a includes three inductors L12, L23 and L13 interconnected into a T configuration, as illustrated. More specifically, the inductors L12 and L23 are interconnected in serial with the opposite ends interconnected to the nodes P1 and P2. The series of inductors L12 and L23 has its intermediate node P51 interconnected to one terminal of the inductor L13. The inductor L13 has its another terminal interconnected to a common node P56 connected to the ground terminals GND1 and GND2.

The two-terminal circuit 31a will be equivalent to the two terminal circuit 31 if the following expressions are satisfied between the inductances of the inductors L12, L23 and L13, and L1, L2 and L3:

$L12=L1*L2/K$, $L23=L2*L3/K$, and $L13=L1*L3/K$, where $K=L1+L2+L3$. For example, with the two-terminal circuit 31 of the illustrative embodiment shown in FIG. 1, when $L1=L2=L3=0.2$ nH, the two-terminal circuit 31a of the alternative embodiment will be equivalent to the former if $L12=L23=L13=0.06$ nH. The inductors L1, L2 and L3 may be adapted to have inductances which are different from each other.

In summary, in accordance with the present invention, a polar SAW filter has a plurality of attenuation poles in each of the higher-frequency and lower-frequency attenuation ranges of a pass band. The SAW filter is therefore not only miniature, but also realizes sufficient attenuation in both of the lower-frequency and higher-frequency attenuation ranges in accordance with the variation of the attenuation poles.

The entire disclosure of Japanese patent application No. 2001-3488 filed on Jan. 11, 2001, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A polar SAW filter comprising:

a first serial arm SAW resonator having a first and a second electrode connected to an input port and an output port, respectively;

a first parallel arm SAW resonator having a first electrode connected to the input port;

a second parallel arm SAW resonator having a first electrode connected to the output port;

a first inductor having a first terminal connected to a second electrode of said first parallel arm SAW resonator and a second terminal connected to a ground terminal;

a second inductor having a first terminal connected to a second electrode of said second parallel arm SAW resonator and a second terminal connected to the ground terminal; and a third inductor having a first terminal directly connected to the second electrode of said first parallel arm SAW resonator and a second terminal directly connected to the second electrode of said second parallel arm SAW resonator.

2. The polar SAW filter in accordance with claim 1, further comprising:

a second serial arm SAW resonator having a first and a second electrode connected to the input port and the first electrode of said first serial arm SAW resonator, respectively;

a third parallel arm SAW resonator having a first electrode connected to the input port; and a fourth inductor having a first terminal connected to a second electrode of said third parallel arm SAW resonator and a second terminal connected to the ground terminal.

3. The polar SAW filter in accordance with claim 2, further comprising a supporting member in a form of package or chip on which said polar SAW filter is fabricated, said first, second, third and fourth inductors being in a form of electrical connection formed on said supporting member.

4. The polar SAW filter in accordance with claim 3, wherein said first, second and fourth inductors are in a form of bonding wire formed on said supporting member and connecting the second electrodes of said first, second and third parallel SAW resonators to the ground terminal.

5. The polar SAW filter in accordance with claim 3, wherein said third inductor is in a form of electrode pattern formed on said supporting member and connecting the second electrodes of said first and second parallel SAW resonators to each other.

6. The polar SAW filter in accordance with claim 3, wherein said first, second, fourth and third inductors are in a form of bonding wire formed on said supporting member and connecting the second electrodes of said first, second and third parallel SAW resonators to the ground terminal, and the second electrodes of said first and second parallel SAW resonators to each other, respectively.

7. The polar SAW filter in accordance with claim 1, further comprising a supporting member in a form of package or chip on which said polar SAW filter is fabricated, said first, second and third inductors being in a form of electrical connection formed on said supporting member.

8. The polar SAW filter in accordance with claim 7, wherein said first, second and third inductors are in a form of bonding wire formed on said supporting member and connecting the second electrodes of said first and second parallel SAW resonators to the ground terminal, and to each other, respectively.

9. The polar SAW filter in accordance with claim 7, wherein said first and second inductors are in a form of bonding wire formed on said supporting member and connecting the second electrodes of said first and second parallel SAW resonators to the ground terminal.

10. The polar SAW filter in accordance with claim 7, wherein said third inductor is in a form of electrode pattern formed on said supporting member and connecting the second electrodes of said first and second parallel SAW resonators to each other.

[11. A polar SAW filter comprising:

a first serial arm SAW resonator having a first electrode and a second electrode connected to an input port and an output port, respectively;

a first parallel arm SAW resonator having a first electrode connected to the input port;

a second parallel arm SAW resonator having a first electrode connected to the output port;

a first inductor having a first terminal connected to a second electrode of said first parallel arm SAW resonator and having a second terminal connected to a ground terminal;

a second inductor having a first terminal connected to a second electrode of said second parallel arm SAW resonator and having a second terminal connected to the ground terminal;

a third inductor having a first terminal connected to the second electrode of said first parallel arm SAW resonator and having a second terminal connected to the second electrode of said second parallel arm SAW resonator; and a supporting member in a form of a package or a chip on which said polar SAW filter is fabricated, said first, second and third inductors being in a form of electrical connection formed on said supporting member, said first and second inductors being in a form of a bonding wire formed on said supporting member and connecting the second electrodes of said first and second parallel SAW resonators to the ground terminal.]

[12. The polar SAW filter in accordance with claim 11, further comprising:

a second serial arm SAW resonator having a first electrode and a second electrode connected to the input port and the first electrode of said first serial arm SAW resonator, respectively;

a third parallel arm SAW resonator having a first electrode connected to the input port; and a fourth inductor having a first terminal connected to a second electrode of said third parallel arm SAW resonator and having a second terminal connected to the ground terminal.]

[13. The polar SAW filter in accordance with claim 12, wherein said fourth inductor is in a form of an electrical connection formed on said supporting member.]

14. The polar SAW filter in accordance with claim [13] *15*, wherein said fourth inductor is in a form of a bonding wire formed on said supporting member and connecting the second electrode of said third parallel SAW resonator to the ground terminal.

15. [The] *A* polar SAW filter [in accordance with claim 13] *comprising:*

*a first serial arm SAW resonator having a first electrode and a second electrode connected to an input port and an output port, respectively;*

*a first parallel arm SAW resonator having a first electrode connected to the input port;*

*a second parallel arm SAW resonator having a first electrode connected to the output port;*

*a first inductor having a first terminal connected to a second electrode of said first parallel arm SAW resonator and having a second terminal connected to a ground terminal;*

*a second inductor having a first terminal connected to a second electrode of said second parallel arm SAW resonator and having a second terminal connected to the ground terminal;*

*a third inductor having a first terminal connected to the second electrode of said first parallel arm SAW resonator and having a second terminal connected to the second electrode of said second parallel arm SAW resonator; and*

*a supporting member in a form of a package or a chip on which said polar SAW filter is fabricated, said first, second and third inductors being in a form of electrical connection formed on said supporting member;*

*a second serial arm SAW resonator having a first electrode and a second electrode connected to the input port and the first electrode of said first serial arm SAW resonator, respectively;*

*a third parallel arm SAW resonator having a first electrode connected to the input port; and*

*a fourth inductor having a first terminal connected to a second electrode of said third parallel arm SAW resonator and having a second terminal connected to the ground terminal,*

*said first and second inductors being in a form of a bonding wire formed on said supporting member and connecting the second electrodes of said first and second parallel SAW resonators to the ground terminal,* wherein said third inductor is in a form of an electrode pattern formed on said supporting member and connecting the second electrodes of said first and second parallel SAW resonators to each other, *and*

*wherein said fourth inductor is in a form of an electrical connection formed on said supporting member.*

[16. The polar SAW filter in accordance with claim 13, wherein said fourth and third inductors are in a form of a bonding wire formed on said supporting member and connecting the second electrode of said third parallel SAW resonator to the ground terminal, and the second electrodes of said first and second parallel SAW resonators to each other, respectively.]

[17. The polar SAW filter in accordance with claim 11, wherein said third inductor is in a form of a bonding wire formed on said supporting member and connecting the second electrodes of said first and second parallel SAW resonators to each other.]

[18. The polar SAW filter in accordance with claim 11, wherein said third inductor is in a form of an electrode pattern formed on said supporting member and connecting the second electrodes of said first and second parallel SAW resonators to each other.]

[19. A polar SAW filter formed on a piezoelectric substrate and having an input port and an output port, the input port receiving an input signal and the output port outputting an output signal, comprising:

a first serial arm SAW resonator having a first electrode and a second electrode, the first electrode receiving a signal relative to the input signal, the second electrode transmitting a signal relative to the output signal;

a first parallel arm SAW resonator having a third electrode connected to the first electrode and having a fourth electrode;

a second parallel arm SAW resonator having a fifth electrode connected to the second electrode and having a sixth electrode;

a first contact pad formed on the piezoelectric substrate and connected to the fourth electrode;

a second contact pad formed on the piezoelectric substrate and connected to the sixth electrode;

a first inductor connected between the first contact pad and a ground potential;

a second inductor connected between the second contact pad and the ground potential; and a third inductor formed on the piezoelectric substrate and connected directly to both the first and second contact pads.]

20. The polar SAW filter in accordance with claim [19] *21*, further comprising:

a second serial arm SAW resonator connected between the input port and the first electrode;

a third parallel arm SAW resonator having a seventh electrode connected to the input port and having an eighth electrode; and a fourth inductor connected between the eighth electrode and the ground potential.

21. [The] *A* polar SAW filter [in accordance with claim 19] *formed on a piezoelectric substrate and having an input port and an output port, the input port receiving an input signal and the output port outputting an output signal, comprising:*

*a first serial arm SAW resonator having a first electrode and a second electrode, the first electrode receiving a signal relative to the input signal, the second electrode transmitting a signal relative to the output signal;*

*a first parallel arm SAW resonator having a third electrode connected to the first electrode and having a fourth electrode;*

*a second parallel arm SAW resonator having a fifth electrode connected to the second electrode and having a sixth electrode;*

*a first contact pad formed on the piezoelectric substrate and connected to the fourth electrode;*

*a second contact pad formed on the piezoelectric substrate and connected to the sixth electrode;*

*a first inductor connected between the first contact pad and a ground potential;*

*a second inductor connected between the second contact pad and the ground potential; and*

*a third inductor formed on the piezoelectric substrate and connected directly to both the first and second contact pads,* wherein the third inductor is formed by a bonding wire.

22. The polar SAW filter in accordance with claim 21, wherein each of the first and second inductors are formed by a bonding wire.

23. The polar SAW filter in accordance with claim 22, further comprising a package on which the piezoelectric substrate is mounted.

24. The polar SAW filter in accordance with claim 23, further comprising a third contact pad formed on the package, wherein the first inductor is connected between the first contact pad and the third contact pad, and the second inductor is connected between the second contact pad and the third contact pad.

[25. The polar SAW filter in accordance with claim 19, wherein the third inductor is formed by an interconnecting pattern.]

[26. The polar SAW filter in accordance with claim 25, wherein each of the first and second inductors are formed by a bonding wire.]

[27. The polar SAW filter in accordance with claim 26, further comprising a package on which the piezoelectric substrate is mounted.]

[28. The polar SAW filter in accordance with claim 27, further comprising a third contact pad formed on the package, wherein the first inductor is connected between the first contact pad and the third contact pad, and the second inductor is connected between the second contact pad and the third contact pad.]

*29. A surface acoustic wave filter comprising:*

*a first SAW resonator located between a first node and a second node;*

*a second SAW resonator located between the first node and a third node;*

*a third SAW resonator located between the second node and a fourth node;*

*a first bonding wire directly connected between the third and fourth nodes;*

*a second bonding wire connected between the fourth node and a ground node; and*

*a piezoelectric substrate on which the first, second and third SAW resonators, the third node and the fourth node are located.*

*30. The surface acoustic wave filter of claim 29, wherein the second bonding wire is directly connected between the fourth node and the ground node.*

*31. The surface acoustic wave filter of claim 29, further comprising a third bonding wire connected between the third node and ground.*

*32. The surface acoustic wave filter of claim 29, wherein the first node is electrically connected to an input terminal, and the second node is electrically connected to an output terminal.*

*33. The surface acoustic wave filter of claim 32, further comprising a fourth SAW resonator located between the input terminal and the first node.*

*34. The surface acoustic wave filter of claim 33, further comprising a fifth SAW resonator located between the input terminal and ground.*

*35. The surface acoustic wave filter of claim 29, wherein the second SAW resonator is directly connected to the third node, and the third SAW resonator is directly connected to the fourth node.*

*36. The surface acoustic wave filter of claim 35, wherein the third and fourth nodes are contact pads.*

*37. A surface acoustic wave filter comprising:*

*a first SAW resonator electrically connected to a first node and a second node;*

*a second SAW resonator electrically connected to the first node and a third node;*

*a third SAW resonator electrically connected to the second node and a fourth node;*

*a first bonding wire directly connected between the third and fourth nodes;*

*a second bonding wire connected between the fourth node and a ground node; and*

*a piezoelectric substrate on which the first, second and third SAW resonators, the third node and the fourth node are located.*

*38. The surface acoustic wave filter of claim 37, wherein the second bonding wire is directly connected between the fourth node and the ground node.*

*39. The surface acoustic wave filter of claim 37, further comprising a third bonding wire connected between the third node and ground.*

*40. The surface acoustic wave filter of claim 37, wherein the first node is electrically connected to an input terminal, and the second node is electrically connected to an output terminal.*

*41. The surface acoustic wave filter of claim 40, further comprising a fourth SAW resonator located between the input terminal and the first node.*

*42. The surface acoustic wave filter of claim 41, further comprising a fifth SAW resonator located between the input terminal and ground.*

*43. The surface acoustic wave filter of claim 37, wherein the second SAW resonator is directly connected to the third node, and the third SAW resonator is directly connected to the fourth node.*

*44. The surface acoustic wave filter of claim 43, wherein the third and fourth nodes are contact pads.*

*45. A surface acoustic wave filter comprising:*

*a serial arm SAW resonator having a first side and a second side;*

*a first contact pad;*

*a second contact pad;*

*a first parallel arm SAW resonator connected to the first side of the serial arm SAW resonator and the first contact pad;*

*a second parallel arm SAW resonator connected to the second side of the serial arm SAW resonator and the second contact pad;*

*a first bonding wire directly connected between the first and second contact pads; and*

*a second bonding wire directly connected with both of the second contact pad and a ground pad,*

*wherein the first parallel arm SAW resonator is directly connected to the first contact pad, and the second parallel arm SAW resonator is directly connected to the second contact pad.*

*46. A surface acoustic wave filter comprising:*

*a serial arm SAW resonator having a first side and a second side;*

*a first contact pad;*

*a second contact pad;*

*a first parallel arm SAW resonator connected to the first side of the serial arm SAW resonator and the first contact pad;*

*a second parallel arm SAW resonator connected to the second side of the serial arm SAW resonator and the second contact pad;*

*a first bonding wire directly connected between the first and second contact pads;*

*a second bonding wire directly connected with both of the second contact pad and a ground pad; and*

*a piezoelectric substrate with the first and second contact pads, the serial arm SAW resonator and the first and second parallel arm SAW resonators thereon.*

*47. The surface acoustic wave filter of claim 46, further comprising a third bonding wire directly connected with both of the first contact pad and the ground pad.*

*48. A SAW filter package comprising:*

*a package body;*

*a piezoelectric substrate formed on the package body;*

*a first SAW resonator formed on the piezoelectric substrate, wherein the first SAW resonator is electrically connected between a first node and a second node;*

*a second SAW resonator formed on the piezoelectric substrate, wherein the second SAW resonator is electrically connected between the first node and a third node, the third node being located on the piezoelectric substrate;*

*a third SAW resonator formed on the piezoelectric substrate, wherein the third SAW resonator is electrically connected between the second node and a fourth node, the fourth node being located on the piezoelectric substrate;*

*a first bonding wire directly connected between the third and fourth nodes;*

*a ground pad formed on the package body; and*

*a second bonding wire connected between the fourth node and the ground pad.*

*49. The SAW filter package of claim 48, wherein the second bonding wire is connected directly with both of the fourth node and the ground pad.*

*50. The SAW filter package of claim 49, wherein the third SAW resonator is connected directly with both of the second node and the fourth node.*

*51. The SAW filter package of claim 48, further comprising a third bonding wire connected between the third node and ground.*

*52. The SAW filter package of claim 48, wherein the first node is electrically connected to a first contact pad formed on the package body, and the second node is electrically connected to a second contact pad formed on the package body which is different from the first contact pad.*

*53. The SAW filter package of claim 52, further comprising a fourth SAW resonator formed on the piezoelectric substrate, wherein the fourth SAW resonator is electrically connected between the first contact pad and ground.*

*54. The SAW filter package of claim 48, wherein the second SAW resonator is directly connected to the third node, and the third SAW resonator is directly connected to the fourth node.*

*55. The SAW filter package of claim 54, wherein the third and fourth nodes are contact pads.*

* * * * *

UNITED STATES PATENT AND TRADEMARK OFFICE

CERTIFICATE OF CORRECTION

PATENT NO. : RE43,958 E
APPLICATION NO. : 11/328497
DATED : February 5, 2013
INVENTOR(S) : Noguchi et al.

It is certified that error appears in the above-identified patent and that said Letters Patent is hereby corrected as shown below:

On Title Page 2, item (56), References Cited, under "OTHER PUBLICATIONS", in Column 2, Line 1, delete "Corono" and insert -- Corona --, therefor.

In the Specification

In Column 3, Line 22, delete "they be" and insert -- they are --, therefor.

In Column 6, Line 57, delete "(110)" and insert -- (110)) --, therefor.

In Column 6, Line 62, delete "FIG. 12."" and insert -- FIG. 12. --, therefor.

In Column 7, Line 39, in Equation (7), delete "$ZS=(S^2+3^2+S^2*L22*Cs*(S^2+\omega4^2))/(S*Cs*(S^2+\omega4^2))$," and insert -- $ZS=(S^2+\omega3^2+S^2*L22*Cs*(S^2+\omega4^2))/(S*Cs*(S^2+\omega4^2))$, --, therefor.

In Column 7, Line 50, after Equation (8), insert -- . --.

In Column 8, Line 10, after Equation (11), insert -- . --.

In Column 9, Line 45, delete ""FIG. 17" and insert -- FIG. 17 --, therefor.

In Column 9, Line 54, delete "strip 140" and insert -- strip 14C --, therefor.

In Column 9, Line 55, delete "reasons."" and insert -- reasons. --, therefor.

In the Claims

In Column 11, Line 67, in Claim 6, delete "fourth and third" and insert -- third and fourth --, therefor.

Signed and Sealed this
Twenty-fourth Day of June, 2014

Michelle K. Lee

Michelle K. Lee
*Deputy Director of the United States Patent and Trademark Office*